(12) United States Patent
Creamer et al.

(10) Patent No.: US 11,581,299 B2
(45) Date of Patent: Feb. 14, 2023

(54) FLEXIBLE IMPEDANCE NETWORK SYSTEM

(71) Applicant: BAE Systems Information and Electronic Systems Integration Inc., Nashua, NH (US)

(72) Inventors: Carlton T. Creamer, Brookline, NH (US); Daniel C. Boire, Nashua, NH (US); Kanin Chu, Nashua, NH (US); Hong M. Lu, Wayland, MA (US); Bernard J. Schmanski, Merrimack, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 335 days.

(21) Appl. No.: 16/817,588

(22) Filed: Mar. 12, 2020

(65) Prior Publication Data

US 2020/0294987 A1 Sep. 17, 2020

Related U.S. Application Data

(60) Provisional application No. 62/817,493, filed on Mar. 12, 2019.

(51) Int. Cl.
*H01L 27/02* (2006.01)
*H04B 1/40* (2015.01)
*H01L 23/66* (2006.01)

(52) U.S. Cl.
CPC ......... *H01L 27/0207* (2013.01); *H01L 23/66* (2013.01); *H04B 1/40* (2013.01); *H01L 2223/6605* (2013.01); *H01L 2223/6655* (2013.01)

(58) Field of Classification Search
CPC ............... H01L 27/0207; H01L 23/66; H01L 2223/6605; H01L 2223/6655
See application file for complete search history.

(56) References Cited

U.S. PATENT DOCUMENTS

| 4,959,705 | A |   | 9/1990  | Lemnios et al. |
| 5,574,402 | A | * | 11/1996 | Nakajima ............... H01L 23/66 330/307 |
| 6,180,437 | B1 |  | 1/2001  | Moghe et al. |

OTHER PUBLICATIONS

Mondal, J., et al., Ka- and W- Band MMICs on Microwave and Millimeterwave Device Arrays (MMDA) using 0.1 μm T-gate PHEMT, GaAs IC Symposium, 1997, 279-282.
Turner, E. et al., Application Specific MMIC: A Unique and Affordable Approach to MMIC Development, IEEE 1988 Microwave and Millimeter-Wave Monolithic Circuits Symposium, 1988, 9-14.

* cited by examiner

*Primary Examiner* — Tucker J Wright
(74) *Attorney, Agent, or Firm* — Scott J. Asmus; Gary McFaline

(57) ABSTRACT

Techniques and architecture are disclosed for a method for making a custom circuit comprising forming a common wafer template, selecting at least two elements of the common wafer template to be chosen elements, and adding at least one metal layer to interconnect the chosen elements to form a circuit. The common wafer template includes a plurality of transistors, a plurality of resistors, a plurality of capacitors, and a plurality of bond pads. Final circuit customization of the common wafer template is accomplished by adding at least one metal layer that forms interconnects to passive and active elements in the template in order to complete the circuit.

9 Claims, 5 Drawing Sheets

310

320

330

FLEXIBLE IMPEDANCE NETWORK SYSTEM

CROSS-REFERENCE TO RELATED APPLICATIONS

This application claims the benefit of U.S. Provisional Patent Application No. 62/817,493, filed on Mar. 12, 2019, which is herein incorporated by reference in its entirety.

STATEMENT OF GOVERNMENT INTEREST

This invention was made with government support under Contract No. (W911QX-13-C-0050) awarded by the United States Army. The United States Government has certain rights in the inventions.

FIELD OF THE DISCLOSURE

The following disclosure relates generally to an integrated circuit design template and in particular a flexible impedance network system (FINS) for enabling efficient iterative design by leveraging a common wafer platform as the starting point for circuit design.

BACKGROUND

Fully customized Radio Frequency Integrated Circuits (RFICs) are a widely accepted solution for achieving high performance or circuit functionality that is not available from Commercial Off the Shelf (COTS) products. While fully customizable RFICs offer the most flexibility to a circuit designer, there are several disadvantages. Development of custom RFICs come with high cost, owing to lengthy, iterative design and wafer fabrication that requires a complex custom design and an extended production process.

In the 1980s, prior template methods utilized low-density templates with limited passives and uniquely designed footprint building blocks. Each required highly customized templates as well as separate characterization and modeling in order to complete designs. This essentially makes this approach a fully custom circuit as opposed to a true flexible template. These constraints limit the usefulness of the previous methods and fail to achieve a broad application of the fabricated wafer template. Additionally, they have long wafer fabrication cycle times and generally cannot be reused.

Therefore, there is a need for a high-density template that enables a shortened wafer fabrication cycle time, allows circuit customization, and reuse. Thus, a custom RFIC design and fabrication system and method that may be applied for RF based circuits is disclosed.

SUMMARY

An example embodiment of the present disclosure provides a method for making a flexible impedance network system that includes forming a common wafer template; selecting at least two elements of the common wafer template to be chosen elements; and adding at least one metal layer to interconnect the chosen elements to form a circuit. The common wafer template includes a plurality of transistor arrays, a plurality of variable resistors, a plurality of capacitors, and a plurality of bond pads.

Particular implementations may include one or more of the following features. The common wafer template may be a single high-density template. The method may further comprise adding a second metal layer to interconnect the chosen elements to form the circuit. The method may further comprise adding a third metal layer to interconnect the chosen elements to form the circuit. Additionally, the plurality of capacitors can be in the interior or periphery of the common wafer template, which enables in-line and orthogonal signal routing. At least one of the plurality of capacitors may be an adjustable capacitor. At least one of the plurality of resistors may be a variable resistor. The common wafer template may be for a radio frequency integrated circuit, and the common wafer template may be a GaN-on-SiC common wafer template.

Another example embodiment of the present disclosure provides a customized RF circuit including a common wafer template, at least two chosen elements selected from the common wafer template, and at least one metal layer configured to interconnect the chosen elements to form the RF circuit. The common wafer template includes a plurality of transistors, a plurality of resistors, a plurality of capacitors, and a plurality of bond pads.

Particular implementations may include one or more of the following features. The circuit may be configured to be a filter. The circuit may be configured to be a switch. The circuit may be configured to be a distributed amplifier.

Another example embodiment of the present disclosure provides a common wafer template including a substrate, a plurality of transistors built on the substrate, a plurality of resistors built on the substrate, a plurality of capacitors built on the substrate, and a plurality of bond pads built on the substrate. Additionally, the transistors, capacitors, and resistors are not connected.

Particular implementation may include one or more of the following features. The template may be a single high-density template. The plurality of transistors may be scalable. The plurality of transistors may be pre-stabilized. The plurality of transistors may have a range between 200 μm and 3,200 μm. At least one of the plurality of capacitors may be adjustable. At least one of the plurality of resistors may be a variable resistor. The plurality of bond pads may be placed around a peripheral edge of the common wafer template. The plurality of capacitors may be placed around the peripheral edge of the common wafer template.

Implementations of the techniques discussed above may include a method or process, a system or apparatus, a kit, or a computer software stored on a computer-accessible medium. The details or one or more implementations are set forth in the accompanying drawings and the description below. Other features will be apparent from the description and drawings, and form the claims.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

Figure 1:
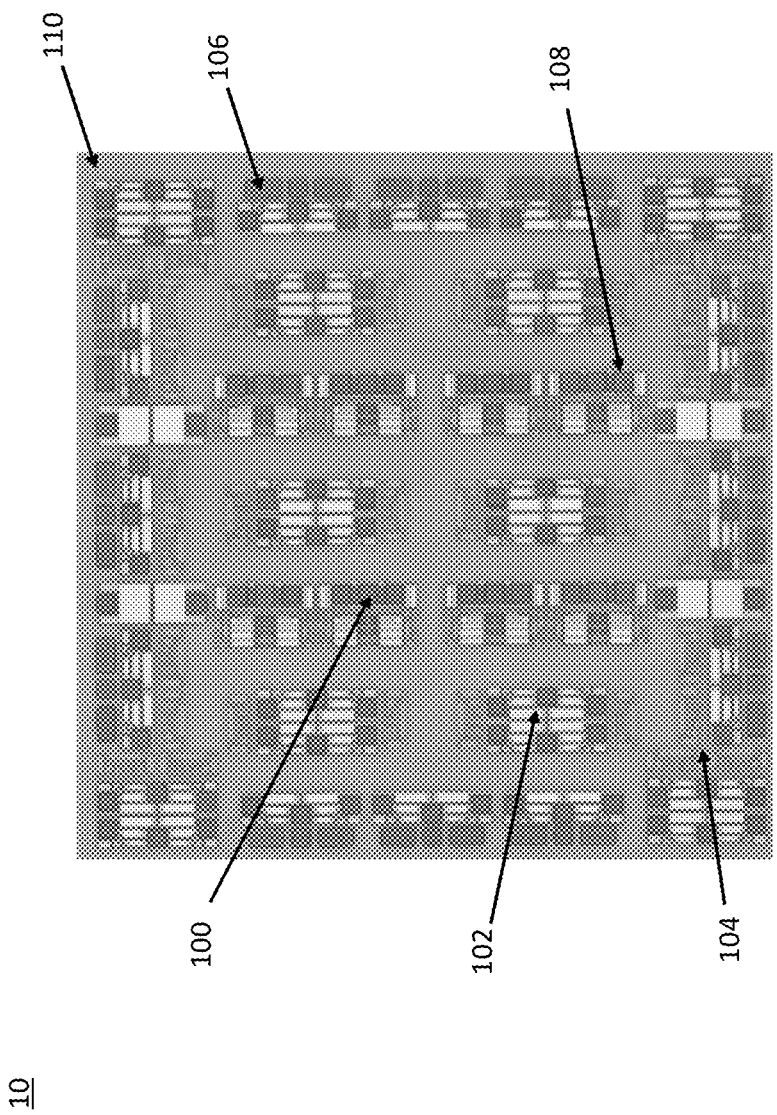
FIG. 1 is a block diagram of one embodiment of the common wafer template in the present disclosure.

These and other features of the present embodiments will be understood better by reading the following detailed description, taken together with the figures herein described. The accompanying drawings are not intended to be drawn to scale. For purposes of clarity, not every component may be labeled in every drawing.

DETAILED DESCRIPTION

This disclosure relates to a method that utilizes a pre-designed, partially fabricated template as a process starting point for a circuit design called the Flexible Impedance Network System (FINS). In particular, one embodiment relates to a monolithic microwave integrated circuit (MMIC) development method. FINS supports use over a wide range of circuit functions and a broad spectrum. The circuit design template includes a plurality of transistor arrays, a plurality of variable resistors, a plurality of capacitors, and a plurality of bond pads. The common wafer template in one example is a single high-density template. The present disclosure allows for circuit customization, IP reuse, and efficiency in fabricating the wafer template.

According to one embodiment, FINS represents a novel design implementation for III-V RF integrated circuits, using standardized template with pre-fabricated active and passive components, providing a substantial reduction of cycle time in circuit fabrication and associated costs Fully custom RFICs require relatively long MMIC design and fabrication timelines that delay insertion of much needed capability and are inconsistent with a need for greater agility in response to rapidly evolving technologies. Other templates have been proposed for RFIC creation; however, each still requires extensive customization and, thus, do not truly achieve a flexible template approach.

The final circuit functionality and configuration is determined by the additive processing of the final metal layers, which can be up to three metal layers. This allows the circuit designer to customize a design and fabricate the wafer in less time compared to fully custom RFICs. Utilizing a pre-fabricated template arrangement allows for quick prototyping and shortens the overall wafer fabrication cycle times. This approach also readily facilitates circuit transport between design groups by providing a common template that can be provided to a third party foundry for final customizations.

The forming of the common wafer template results in a pre-fabricated template that allows a wide flexibility in designing a circuit. For example, the circuit can be a filter, a switch, or a distributed amplifier. Having the ability to form various circuits from a single template helps decrease the length of time to fabricate the circuit and allows for IP reuse.

In other proposed template approaches, each fabricated low-density template must be individually tested and modeled in order to proceed with the design. Previous proposed templates have been severely limited in density, passive elements, and available transistor sizes. Additionally, they require characterization and point modeling on template structures to be useful. These constraints limit the usefulness and do not achieve the broad application of a true template approach.

Thus, and in accordance with an embodiment of the present disclosure, techniques and architecture are disclosed for a method that utilizes a circuit design approach that enables an efficient iterative design by leveraging a common, partially fabricated, wafer platform as the starting point.

The present disclosure achieves wide radio frequency circuit function and spectral diversity while speeding up the RFIC prototyping process by significantly reducing the cycle time. For example, a traditional method can take up to twenty-six weeks to fabricate a MMIC circuit whereas the FINS method can fabricate a MMIC circuit in eight weeks. Other advantages include the improvement of IP transportability between semiconductor foundries and being cost effective for implementing MMIC chips on a system. Another advantage is that the template can be connected across reticle boundaries for supporting design and fabrication of larger subsystem chips.

Specifically, the present disclosure proposes a design and fabrication method for a MMIC circuit employing a common wafer template to enable fast, iterative prototyping. The common wafer template can be a GaN-on-SiC template but is not limited to this technology (e.g.: could be readily implemented on GaAs) and be on a partially fabricated 4", 6", or other wafer platform. Additionally, the common wafer template is commonly a single high-density template.

The circuit design of the template offers a wide flexibility using an array of highly configurable tuning networks combined with transistor arrays. Generally, the circuit design template includes a plurality of transistor arrays, a plurality of variable resistors, a plurality of capacitors, and a plurality of bond pads. The bond pads are selectable by the circuit designer, which allows further customization of the circuit template.

The final circuit functionality and configuration is determined by additive processing of at least one final metal layer that forms interconnects to passive and active elements in the template to complete the circuit. The circuit designer will chose active or passive elements in order to form the desired circuit. The active and passive elements of the common wafer template are interconnected by the addition of metal layers during the final customization process of the circuit that are connected through dielectric vias. The circuit designer can utilize the template by using up to three customizable metal layers during final customization of the template. Alternatively, a third party can perform additive processing of the final metal layers.

The common wafer template provides a user-friendly fabrication starting point for the circuit designer or a receiving foundry and allows shared wafer fabrication between the two. This technique and architecture allows for the circuit designer or a receiving foundry to make use of custom metal layers, which maximizes design flexibility and increases the potential for greater circuit density. This enables greater IP reuse, specifically, greater microwave circuit IP reuse.

FIG. 1 is a block diagram of a common wafer template configured in accordance with an embodiment of the present disclosure. The common wafer template 10 may comprise a plurality of transistors 100, a plurality of capacitors 102, a plurality of resistors 104, a plurality of bond pads 106, and a plurality of Through Substrate Vias (TSV) 108 that are formed on a substrate 110. In an embodiment, the common wafer template 10 may be a single high-density template. The plurality of transistors 100 may be scalable and pre-stabilized. The plurality of transistors 100 may be in the range of 200 μm to 3,200 μm (2×100 μm device cell). The plurality of capacitors 102 may be adjustable for making network elements and bias filtering. The plurality of resistors 104 may be adjustable for bias. The plurality of bond pads 106 in one example are placed about the periphery on the common wafer template 10, which enables in-line and orthogonal signal routing. Lastly, a plurality of layers formed on a substrate may be interconnected through TSV 108 via the connections made between layers or to the common wafer template. In an embodiment, the common wafer template 10 may be used for a radio frequency integrated circuit (RFIC). Any of the above described elements can be selected as a chosen element to form a circuit selected by the circuit designer.

Figure 2:
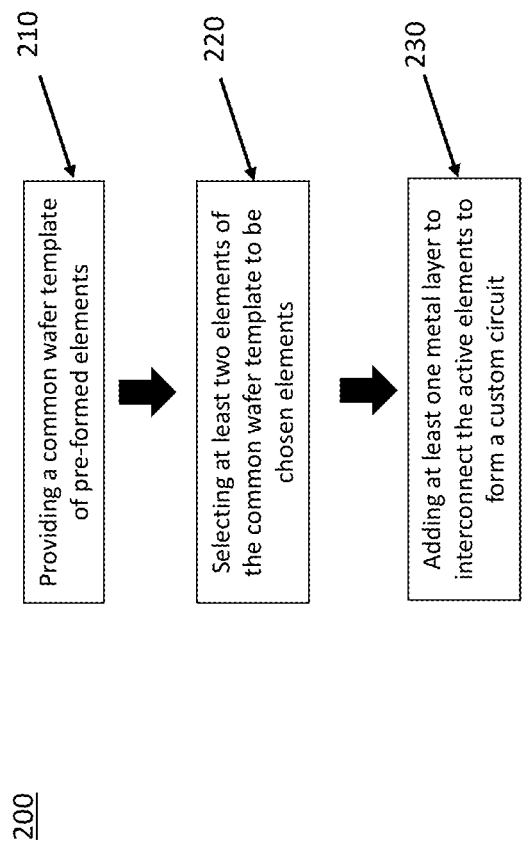
FIG. 2 is a flowchart showing a method for making a flexible impedance network system in accordance with an embodiment of the present disclosure.

FIG. 2 is a flowchart showing a method 200 for making a flexible impedance network system in accordance with an embodiment of the present disclosure. This method allows a circuit designer to have a pre-designed and partially fabricated wafer that allows for circuit customization. The method includes providing a common wafer template 210; selecting at least two elements of the common wafer template to be chosen elements 220; and adding at least one metal layer to interconnect the chosen elements to form an RF circuit 230. Based on the common template, the fabrication of the RFIC is manufactured more rapidly as it starts from a platform of already fabricated devices structures.

The common wafer template in one example includes various elements such as the plurality of transistor arrays 100, the plurality of variable resistors 104, the plurality of capacitors 102, and the plurality of bond pads 106, as shown in FIG. 1 and described above. The customization process includes adding at least one metal layer to the chosen elements in the common wafer template 10. This method may also include adding a second and a third metal layer for final circuit customization. Each of the metal layers form interconnects to passive and active elements in the template to form the circuit.

Figure 3:
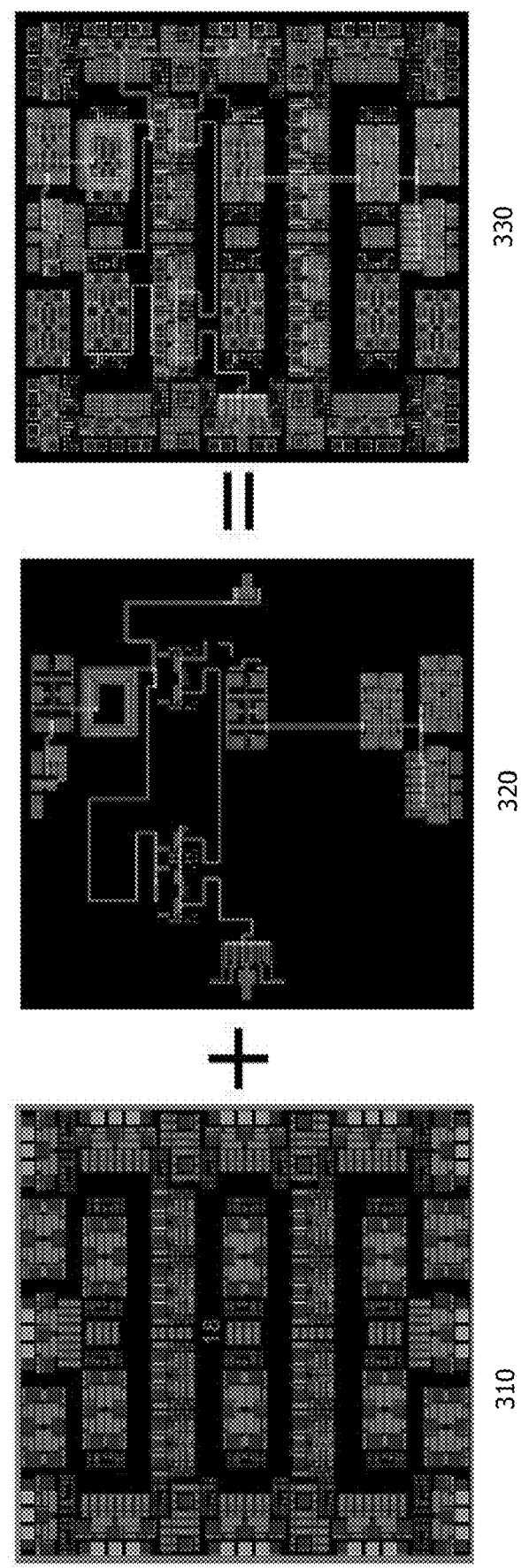
FIG. 3 shows the common wafer template coupled with two metal layers resulting in a distributed amplifier architecture in accordance with an embodiment of the present disclosure.

FIG. 3 shows a pictorial presentation of a distributed amplifier constructed from the common wafer template 310 and metal 2 and 3 layers 320. In this example, the pre-fabricated common reticle 310 is combined with the custom metal layers added to the common template to complete the C-band power distributed amplifier 330. In one example, up to three custom metal layers are available for the circuit designer.

Figure 4:
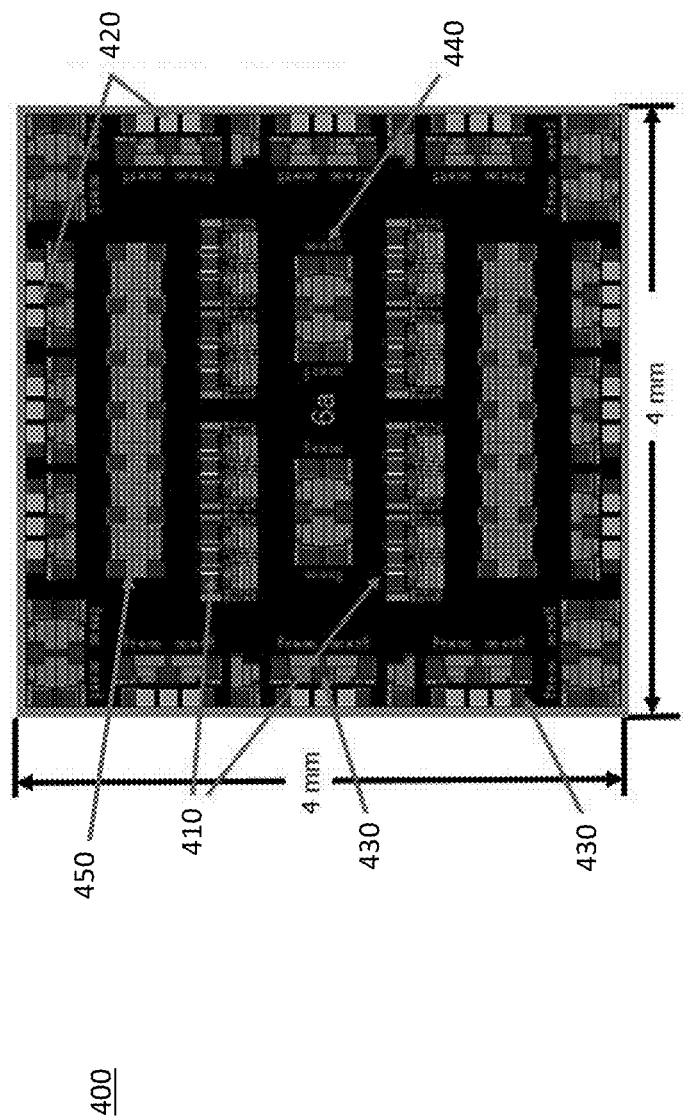
FIG. 4 depicts a common wafer template unit cell according to one embodiment.

Referring to FIG. 4, another example of the common wafer template 400 is shown employing unit cells that are disposed in sections of the wafer template 400. Unit cells of scalable, pre-stabilized transistors 410 are depicted and in this example are 2×100 micron device cell. Ground-Signal-Ground input/output options 420 around the outermost periphery of the wafer template 400 enable in-line and orthogonal signal routing. Adjustable capacitors 430 unit cells are also located along the periphery but internal from the I/O pads 420 and are used for bias conditioning. Adjustable capacitance on the periphery internal side-by-side with the I/O pads 420 can also be used for matching network elements 430. Variable resistors 440 are centrally located on the template 400 between the transistor unit cells 410. These can also be used as bond pads or through substrate via connections. In this example the common wafer template 400 is 4 mm×4 mm. In this example there are two transmission lines 450 that are rectangular and located between the adjustable capacitors 430 and the transistors 410.

Figures 5A, 5B:
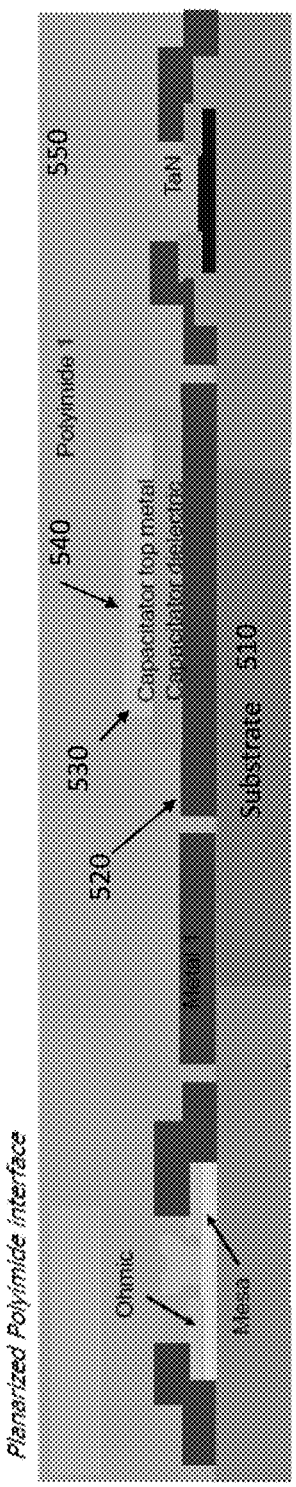
FIG. 5a is a cross-sectional perspective of the common wafer template according to one embodiment.
FIG. 5b is a cross-sectional perspective of the common wafer template following etching and adding metal layers to interconnect the chosen elements according to one embodiment.

Referring to FIGS. 5a and 5b, a cross-section of the common wafer template is shown. FIG. 5a shows the common wafer template and includes the substrate 510 upon which the various structures such as transistors, capacitors, inductors, resistors and vias are built as well as multiple metal layers and interconnects. For example, there is a metal layer 520 on the substrate 510, and a capacitor dielectric 530 is deposited on the metal layer. A capacitor top metal 540 is deposited on the capacitor dielectric 520. A planarized polyimide interface 550 covers the structures to form the common wafer template.

The customization can be done at the originating foundry building the wafer that is specified by the end user, or the end user can take the common wafer template internally and make the custom designed circuit design and fabrication. In one example there are three customizable metal layers. The common wafer template elements of resistors, capacitors, devices, and polyimide 1 are customized to include the polyimide via 1, metal M2 560, polyimide 2 570. In one example the third layer (not shown) includes polyimide via 2, metal layer M3, and metal layer M4. The actual semiconductor processing of etching the polyimide and adding metal pattern layers is well known in the industry.

The present system is distinguished from the convention implementations since it enables much more flexibility in terms of function and integration. Input and output locations are flexible and located over a large section of the periphery and circuits can span multiple templates if necessary. This enables entire circuit architecture and module functions to be integrated onto a single die with rapid design and fabrication times and first pass success, instead of multiple custom chips processed independently and expensively assembled with a great deal of expertise needed. The many selectable resistor, capacitor, inductor, and transistor values and locations on the templates minimize the template performance tradeoffs versus a custom circuit. Use of EM simulators in the design minimizes the proximity effects arising from the dense flexible template.

In summary, the FINS design and fabrication methodology enables shorter wafer fabrication cycle times by leveraging a partially fabricated common wafer template as a starting point. The system allows for circuit customization at internal and external foundries and enables greater microwave circuit IP reuse. The testing demonstrates 12 GHz or higher MMW operations.

The foregoing description of the embodiments of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

A number of implementations have been described. Nevertheless, it will be understood that various modifications may be made without departing from the scope of the disclosure. Although operations are depicted in the drawings in a particular order, this should not be understood as requiring that such operations be performed in the particular order shown or in sequential order, or that all illustrated operations be performed, to achieve desirable results.

What is claimed is:

1. A customized RF circuit, comprising:
   a common wafer template, wherein the common wafer template has elements comprising:

a plurality of transistors,
a plurality of resistors,
a plurality of capacitors, and
a plurality of bond pads;
  at least two chosen elements selected from the common wafer template;
  at least one metal layer configured to interconnect the chosen elements to form the RF circuit; and
  at least one additional common wafer template electrically coupled to the common wafer template.

2. The customized RF circuit of claim 1 wherein the RF circuit is configured to be at least one of filter, a switch and a distributed amplifier.

3. The customized RF circuit of claim 1 wherein the chosen elements are configured to form at least one of C-band circuit, an L-band circuit and an X-band circuit.

4. A common wafer template, comprising:
a substrate;
a plurality of transistors built on the substrate,
a plurality of resistors built on the substrate,
a plurality of capacitors built on the substrate with at least one of the capacitors located along a periphery of the substrate and at least one of the capacitors located interior to the periphery of the substrate, and
a plurality of bond pads built on the substrate and located about the periphery of the substrate;
wherein the transistors, capacitors, and resistors are not electrically coupled.

5. The common wafer template of claim 4 wherein the plurality of transistors are scalable and pre-stabilized.

6. The common wafer template of claim 4 wherein at least one of the plurality of capacitors is adjustable.

7. The common wafer template of claim 4 wherein at least one of the plurality of resistors is a variable resistor.

8. The common wafer template of claim 4 wherein the plurality of bond pads are placed around the peripheral edge of the common wafer template.

9. The common wafer template of claim 4 wherein a location of the plurality of capacitors enables in-line and orthogonal signal routing.

* * * * *